United States Patent
Tang

(10) Patent No.: US 6,744,651 B2
(45) Date of Patent: Jun. 1, 2004

(54) LOCAL THERMAL ENHANCEMENT OF MAGNETIC MEMORY CELL DURING PROGRAMMING

(75) Inventor: Denny Duan-Lee Tang, Saratoga, CA (US)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 99 days.

(21) Appl. No.: 10/251,466

(22) Filed: Sep. 20, 2002

(65) Prior Publication Data

US 2004/0057263 A1 Mar. 25, 2004

(51) Int. Cl.[7] .............................................. G11C 11/14
(52) U.S. Cl. ........................ 365/33; 365/158; 365/171; 365/173; 365/97; 365/66
(58) Field of Search ..................... 365/33, 158, 171, 365/173, 97, 66

(56) References Cited

U.S. PATENT DOCUMENTS

| | | | | |
|---|---|---|---|---|
| 5,012,444 A | * | 4/1991 | Hurst, Jr. et al. | ............ 365/173 |
| 6,072,718 A | | 6/2000 | Abraham et al. | ............ 365/173 |
| 6,104,632 A | * | 8/2000 | Nishimura | .................. 365/158 |
| 6,166,948 A | | 12/2000 | Parkin et al. | ............... 365/173 |
| 6,169,688 B1 | * | 1/2001 | Noguchi | ..................... 365/171 |
| 6,172,904 B1 | * | 1/2001 | Anthony et al. | ............. 365/173 |
| 6,219,212 B1 | | 4/2001 | Gill et al. | ................. 360/324.2 |
| 6,368,878 B1 | | 4/2002 | Abraham et al. | .............. 438/3 |
| 6,385,082 B1 | | 5/2002 | Abraham et al. | ............ 365/171 |
| 6,507,513 B1 | * | 1/2003 | Sharma et al. | ............... 365/158 |
| 2002/0036919 A1 | * | 3/2002 | Daughton et al. | ........... 365/173 |
| 2002/0186584 A1 | * | 12/2002 | McDowell et al. | ......... 365/171 |
| 2003/0007398 A1 | * | 1/2003 | Daughton et al. | ........... 365/200 |
| 2003/0031045 A1 | * | 2/2003 | Hosotani | ..................... 365/158 |
| 2003/0067802 A1 | * | 4/2003 | Anthony et al. | ............. 365/173 |
| 2003/0112655 A1 | * | 6/2003 | Hosotani | ..................... 365/158 |

FOREIGN PATENT DOCUMENTS

JP  411003585 A  *  1/1999  ........... G11C/11/15

* cited by examiner

Primary Examiner—Viet Q. Nguyen
(74) Attorney, Agent, or Firm—George O. Saile; Stephen B. Ackerman

(57) ABSTRACT

A problem associated with the programming of MRAM (magnetic random access memory) has been that the required current is orders of magnitude larger than that needed for many other memory devices such as SRAMs or DRAMs. This problem has been overcome by adding heating lines to the standard array configuration. These lines provide local heating sources located in close proximity to the memory elements so that when a given element is being programmed it is also being heated. The effect of the heating is to lower the threshold for magnetization so that a lower field (and hence reduced program current) can be used. It is also possible to make the base layer of the memory element itself serve as the heating element.

38 Claims, 3 Drawing Sheets

LOCAL THERMAL ENHANCEMENT OF MAGNETIC MEMORY CELL DURING PROGRAMMING

FIELD OF THE INVENTION

The invention relates to the general field of magnetic memories with particular reference to programming MTJ cells.

BACKGROUND OF THE INVENTION

The principle governing the operation of the memory cells in magnetic RAMs is the change of resistivity of certain materials in the presence of a magnetic field (magneto-resistance). Magneto-resistance can be significantly increased by means of a structure known as a spin valve. The resulting increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

The key elements of a spin valve are a low coercivity (free) ferromagnetic layer, a non-magnetic spacer layer, and a high coercivity ferromagnetic layer. The latter is usually formed out of a soft ferromagnetic layer that is pinned magnetically by an associated antiferromagnetic layer. When the free layer is exposed to an external magnetic field, the direction of its magnetization is free to rotate according to the direction of the external field. After the external field is removed, the magnetization of the free layer will stay at a direction, which is dictated by the minimum energy state, determined by the crystalline and shape anisotropy, coupling field and demagnetization field. If the magnetization direction of the pinned layer is parallel to the free layer, electrons passing between the free and pinned layers, suffer less scattering. Thus, the resistance at this state is lower, when current flows along the film plain. If, however, the magnetization of the pinned layer is anti-parallel to the free layer, electrons passing from one layer into the other will suffer more scattering so the resistance of the structure will increase. The change in resistance of spin valve is typically 8–15%.

The simple sandwich structure of ferromagnetic layer-thin conductor-ferromagnetic layer can be used as memory element. In this structure, there is no anti-ferromagnetic layer, thus, neither of the two ferromagnetic layers is pinned. This kind of memory cell is called a pseudo-spin valve memory cell. Both are free to switch magnetization under external field. One of the ferromagnetic layers is thicker than the other, the thicker one switches magnetization direction at a higher external magnetic field.

Of special interest for the present invention is the magnetic tunneling junction (MTJ) in which the layer that separates the free and pinned layers is a non-magnetic insulator, such as alumina or silica. Its thickness needs to be such that it will transmit a significant tunneling current. The principle governing the operation of the MTJ cell in magnetic RAMs is the change of resistivity of the tunnel junction between two ferromagnetic layers. When the magnetization of the two ferromagnetic layers is in opposite directions, the tunneling resistance increases due to a reduction in the tunneling probability. The change of resistance is typically 40%, which is much larger than for GMR devices.

A magnetic tunnel junction device is made up of three basic layers. A top ferromagnetic (FM) layer, a tunnel oxide insulating layer and a bottom FM layer. The magnetization of the top FM layer is free to switch states while the bottom electrical conducting FM layer is pinned, usually by an antiferromagnetic (AF) material, such as PtMn or NiMn. We refer to those layers that are below the tunnel junction as the base layer. Depending on the order in which layers are deposited, the base layer could be a ferromagnetic layer on an antiferromagnetic layer on a seed layer or it could be a single ferromagnetic layer. Typically, the base layer is electrically conductive and the thickness of the base layer is less than 500 Å.

The cell states are programmed by applying an external magnetic field to switch the magnetization of the free layer. A current in the program line under a cell generates the program field.

A problem associated with the programming of MRAM (magnetic random access memory) has been that the required current is orders of magnitude larger than that needed for many other memory devices such as SRAMs or DRAMs, being in the range of 6–10 mA. Furthermore, cell size does not scale with lithography. For such large program currents, the width of the program lines of the cell is much greater than the minimal wire widths allowed by the design rules. In addition, today's MOSFET switches can only provide 0.2–0.5 mA for a gate width of 1 $\mu$m so, to switch a 10-mA current, a MOSFET must be designed with a gate width greater than 20 $\mu$m—which is too large. Thus, it is very important to minimize the program current in MRAMs.

From the point of view of data retention, MRAM cells must maintain a finite switching threshold such that the probability of an accidental cell switch by the thermal energy is negligible. The probability of accidentally switching is proportional to $\mathrm{Exp}(-E/kT)$, where E is the barrier energy between the two states, and $E=Hc*V$, Hc being the coercivity and V the physical volume of the free layer material of the cell. The barrier is a function of cell material and cell geometry. Typically, a MRAM cell must be designed to satisfy $E \leq 40kT$, where k is Boltzmann's constant and T is the absolute temperature of the cell. Hence MRAM cells must not be designed only with arbitrarily small switch fields.

A routine search of the prior art was performed with the following references of interest being found:

U.S. Pat. No. 6,072,718 (Abraham et al.) shows a MRAM cell structure with MTJ structures while, in U.S. Pat. No. 6,368,878 B1, Abraham et al. disclose a MRAM cell structure with MTJ structures. Gill et al. (U.S. Pat. No. 6,219,212 B1) discloses a MRAM cell that includes an insulating AFM and Parkin et al. (U.S. Pat. No. 6,166,948) discusses MRAM cells and MTJ cells. None of these references disclose local heating of individual memory elements.

U.S. Pat. No. 6,385,082 (Abraham et al.) needs more detailed discussion. This reference teaches an array of electrically conducting bit lines and word lines. A storage cell is located at each intersections, each storage cell including at least one magnetically reversible region characterized by a magnetization state which can be more easily reversed by changing its temperature, together with a temperature change generator capable of changing the temperature of a single, selected storage cell as needed. To select a cell, it is preferable to use a brief pulse of tunneling current passing between the appropriate bit and word lines. This provides sufficient Joule heating to facilitate a change in the magnetization state of the selected storage cell (which preferably comprises a ferrimagnetic material).

As will become apparent below, this reference does not make use of the write current pulse to provide the heating current. More specifically, in the present invention, there may be two write currents in two different lines. One or both lines may be used to generate the heat needed to switch a cell. The magnetic field that is generated when current passes through this line(s) can be $H_{assist}$ or $H_{data}$. In particular, our write current does not flow through the tunnel junction, as taught in U.S. Pat. No. 6,385,082. Our heating current flows in the plane of the program line (see first embodiment below) and flows in the plane of the pinned layer (see second embodiment below). Thus, in the present invention, a high resistance region in the cell acts as the heat generator under a write current, not the tunnel junction. The present invention also discloses placing high thermal resistivity material around the cell to prevent heat from leaking out to the neighboring cells. This refinement is not taught in the prior art.

SUMMARY OF THE INVENTION

It has been an object of at least one embodiment of the present invention to provide a GMR based memory element that can be programmed using less current than needed by devices of the prior art.

Another object of at least one embodiment of the present invention has been that neighboring devices not be disturbed when said element is programmed.

Still another object of at least one embodiment of the present invention has been that said elements be addressable by conventional means.

A further object of at least one embodiment of the present invention has been to provide a process for performing said programming operation.

These objects have been achieved by adding heating lines to the standard array configuration. These lines provide local heating sources located in close proximity to the memory elements so that when a given element is being programmed it is also being heated. The effect of the heating is to lower the threshold for magnetization so that a lower field (and hence reduced program current) can be used. The heating line function may also be implemented as part of the bit, word, or programming functions. For the latter case, a further refinement is to make the base layers of the element also serve as the heating element This approach is particularly effective when applied to magnetic tunnel junctions since the tunneling insulator also acts as a thermal insulator during heating.

DESCRIPTION OF THE PREFERRED EMBODIMENTS

Figure 1:
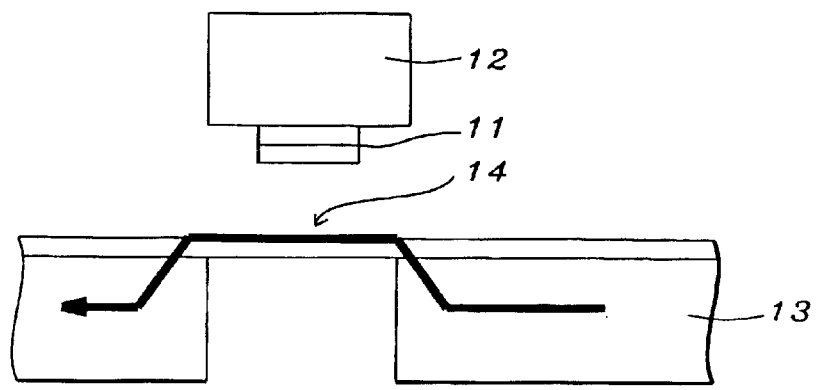
FIG. 1 shows how a local heater may be formed through a local thickness reduction of the heating line.

The problems associated with a simple reduction of the magnetic threshold needed to switch an MRAM cell (in order to reduce the program current) were discussed earlier. These considerations do not, however, rule out using other means to lower the program current for a selected MRAM cell. The basic concept is selective heating of one or a few selected cells, thus reducing for them the magnitude of the field needed to effect switching, and then activating the program line over only one of these cells.

There are many ways to generate such selective local heating. For example, pointing a laser beam at a selected cell will heat up the cell. The simplest way to generate a local hot spot in a current line is to provide an area where the local resistance is higher than elsewhere in the line. This can be accomplished in at least three ways—(1) by locally thinning down the conductor thickness, (2) locally reducing the width of the conductor, and (3) locally increasing the resistivity of the conductor.

One way to implement a local thermally-enhanced programming scheme in magnetic memory array structures is to use intersecting heating and programming lines, the selected cell being at the intersection. The program current in the program line generates a magnetic field large enough to switch the magnetization of the cell at the intersection, but not large enough to switch other (unheated) cells on same program line.

Another approach that is easier to implement in a conventional MRAM cell is to make the program current flow through the base layer of the selected cell, and only the selected cell. Since the width of the cell is considerably less than that of the program line, a local hot spot is realized. The the principal thermal dissipation path is through the tunnel junction and into the bit line over the top free layer of the MTJ device. This path includes the tunnel oxide which is a poor thermal conductor. For a typical base layer material over a poor thermal conducting insulator, the film temperature can rise more than 100° C. at a current density of about 16 mA/sq. micron within about 0.1 microseconds.

Since the probability of switching increases exponentially as a result of local current heating of the MTJ structure, the write field threshold of the selected cell is thermally lowered, and the cell can be written (magnetized) with a smaller current. The write field may be generated by a conventional combination of bit and program line fields or they may be written by the program field alone. The latter case requires special select circuitry that will be described later. With this arrangement, there is no program current in neighboring unselected cells since they are not heated, and their write threshold remains higher than that of the selected cell. The disturb problem during programming of a MRAM array will thus be less likely to occur.

We will disclose the present invention through a description of three processes that embody the application of the general principles discussed above. In the course of so doing, the corresponding embodied structures will become apparent.

1$^{st}$ Embodiment

Figure 4:
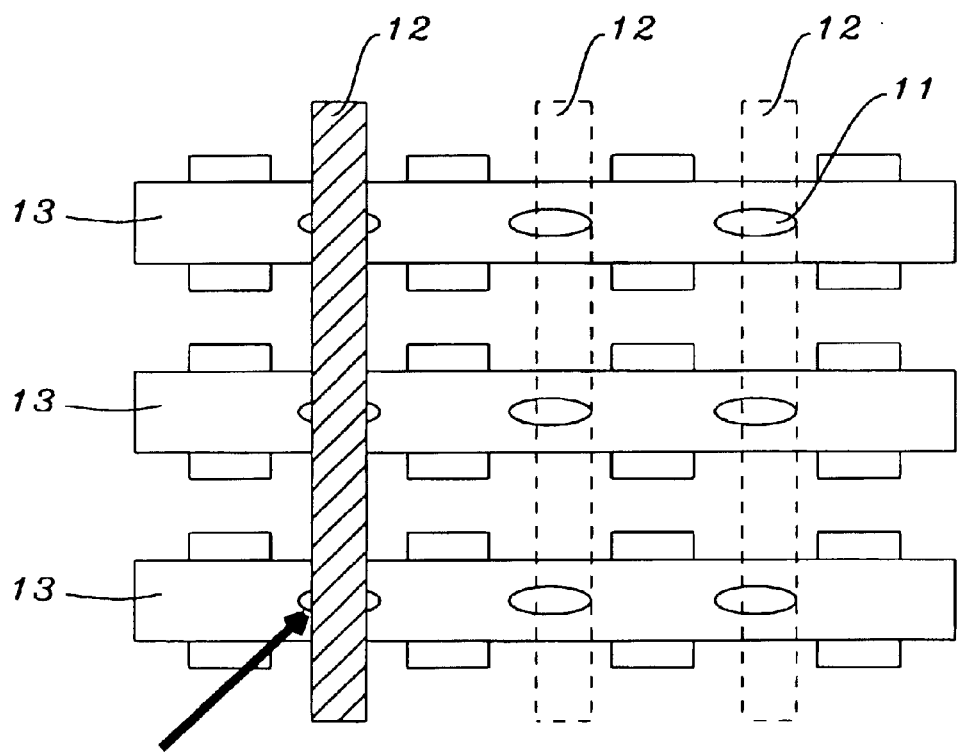
FIG. 4 illustrates an array of heating lines and program lines with a memory element being located at each intersection.

Referring now to FIG. 1, this process begins with the provision of an array of individual memory elements 11 which could be spin valves, pseudo-spin valves, or magnetic tunnel junctions. Program line 12 passes over (or under in inverse versions) element 11 and is in close proximity to it. Located a short distance below (or above) is heating line 13—a key novel feature of the invention. Part of this heating line is hot spot 14 which is located directly below (or above) memory element 11 at a distance of less than about 100–2,000 Angstroms from it. Normally, as illustrated in FIG. 4, the heating and programming lines are orthogonal to one another with the memory elements being located at their intersections.

Figure 2:
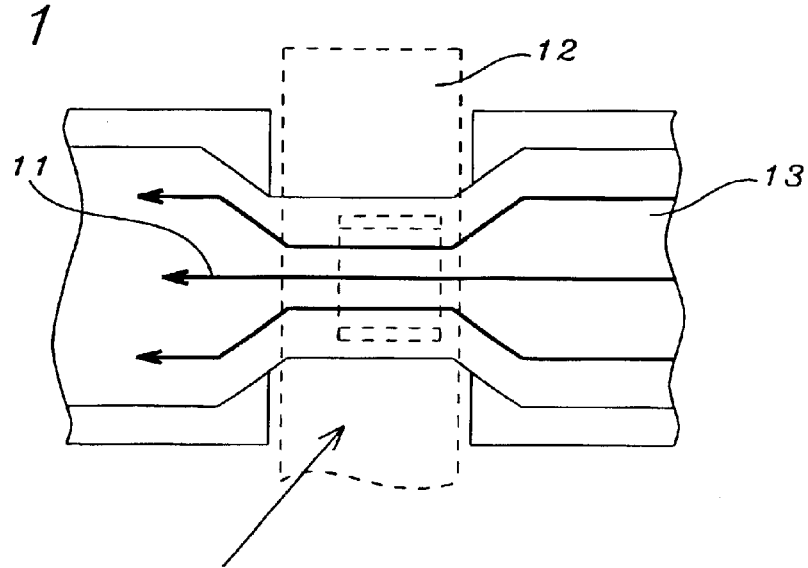
FIG. 2 shows how a local heater may be formed through a local width reduction of the heating line.
Figure 3:
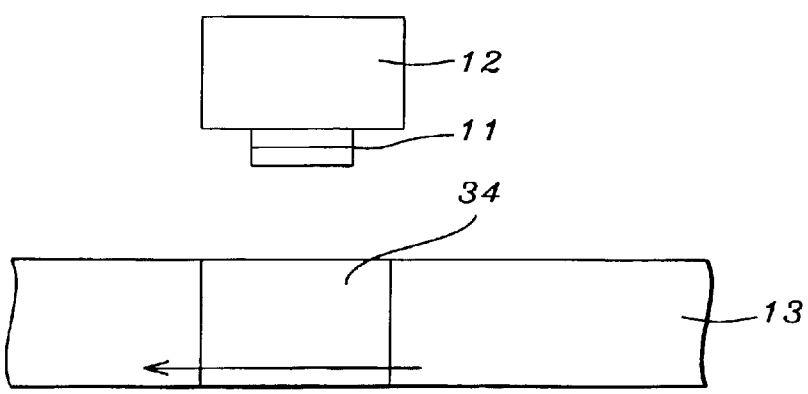
FIG. 3 shows how a local heater may be formed through a local increase in sheet resistance of the heating line.

The hot spot 14 may be implemented in several ways. In FIG. 1 it is implemented as a region of reduced thickness. In FIG. 2 it is area 24 of the program line, where the width of 13 has been reduced, while in FIG. 3 it is area 34 of the program line where the sheet resistance is greater than it is elsewhere in 13. In all three versions of hot spot formation, the heating elements are surrounded by thermally insulating material except between themselves and the memory element that they will be heating.

Using any of these three structures, the process continues with the passing a current (typically between about 0.3 and 3 mA) through the heating line this results in the local heating of all memory elements traversed by the line in question, causing a reduction in the minimum (threshold) field that is required to magnetize these memory elements or, stated more precisely, to set the magnetization direction of their pinned layer. At the same time, a second current passes through the programming line. This second current second current (typically between about 0.3 and 3 mA) needs to be only just sufficient to generate the required reduced threshold field, so the writing of a bit of information into the memory element is achieved at a significantly lower program current than is needed for MRAM devices programmed using prior art methods.

The above description implies that the heating line is a separate line dedicated to providing local hot sources. Depending on considerations such as cost, power consumption, etc. it is possible to for the heating line to also function as a bit and/or word line for the array.

$2^{nd}$ embodiment

This embodiment also begins with the provision of an array of individual memory elements 11 which could be spin valves, pseudo-spin valves, or magnetic tunnel junction. As discussed earlier, memory element has a base layer. It also has bit and programming lines, its main novel feature being that the latter are also the heating lines.

The heating lines of this embodiment differ from those of the first embodiment in an important way. The local hot spots that will provide the joule heating of the memory elements are the base layers of the memory elements. They are able to function as such by virtue of their being significantly narrower than the program lines themselves. Typically, an aluminum programming line would have a thickness between about 0.3 and 0.5 microns (corresponding to a sheet resistance between about 52 and 86 mill-ohms per square) while the thickness of the base layer would be between about 0.02 and 0.04 microns. (corresponding to a sheet resistance between about 40 and 80 ohms per square). Thus, the base layers of the memory elements of all devices on a single program line are connected together through that programming line. As in a conventional array, the bit lines intersect the program lines at the device locations, generally orthogonally.

Thus, an individual device is addressed in the normal way by activating the appropriate bit and program lines, the value added by the present invention being that the addressed memory element will also be heated by its associated local heater on the program line. Similarly, the magnetic field seen by the memory element is the vector sum of the fields generated by the bit and program lines but, as in the $1^{st}$ embodiment, the increased temperature of the memory element allows it to be magnetized by a significantly lower field that would be the case if it were not heated. In this arrangement, the bit line current is between about 0.3 and 3 mA while the program current is between about 0.3 and 3 mA.

$3^{rd}$ embodiment

Figure 5:
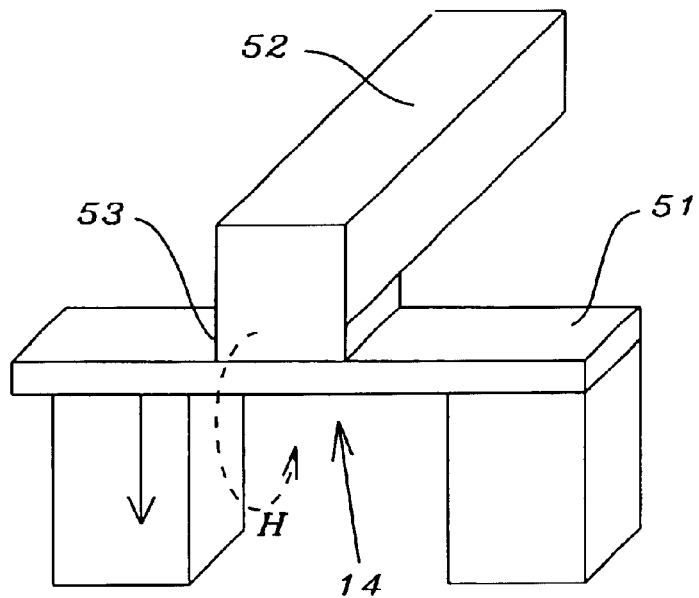
FIG. 5 is a isometric view of one embodiment of the invention.

This embodiment is directed primarily toward programming a magnetic tunnel junction. It is similar to the $2^{nd}$ embodiment in that the base layer(s) of the memory element also serve as the local heaters as well as being part of the program line. Seen in FIG. 5 is an isometric representation of this embodiment.

Figure 6:
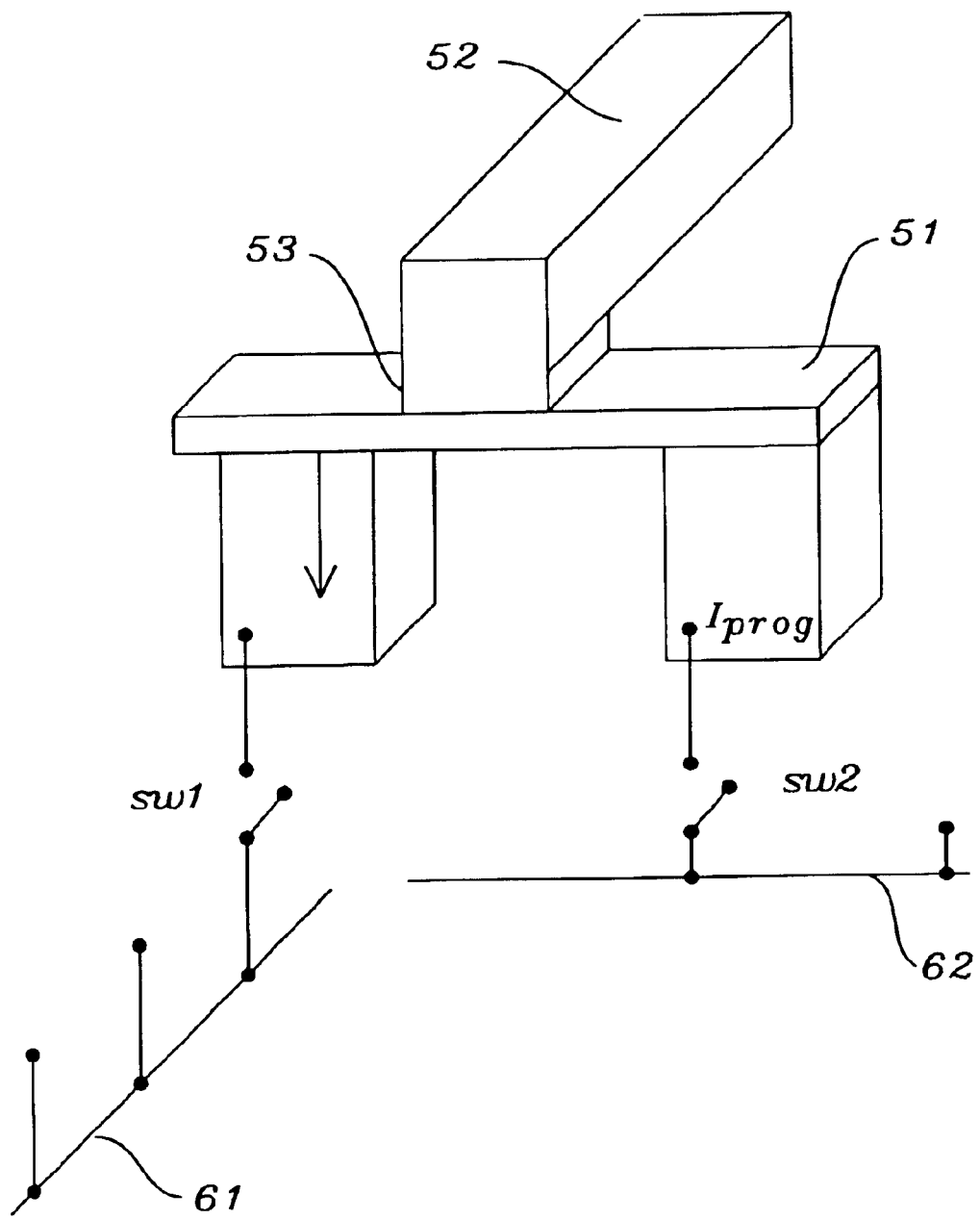
FIG. 6 shows the circuit used in conjunction with the element shown in FIG. 5.

Hot spot 14 is automatically formed when the program line 51 is made to pass through base layer 53. This layer can be a 'ferromagnetic layer on an antiferromagnetic layer on a seed layer' or it could be a single ferromagnetic layer on a seed layer. The key feature of this embodiment is that one, and only one, memory element (and its associated local heater) is selected at any given time. This is accomplished by means of the circuit shown schematically in FIG. 6. The two switches sw1 and sw2 gate the heating current into the selected cell from two orthogonal bus lines 61 and 62 that provide the heating current Once the particular element has been selected, the process proceeds as in the other two embodiments.

This embodiment is particularly effective because the write current in the very thin pinned layer generates heat which is immediately conducted through the tunneling junction into the free layer thereby lowering its switch field without having to first pass through an insulating layer between MTJ 11 and hot spot 14 as shown in FIG. 1. The insulation under the ferromagnetic or the base layer provides a high thermal resistance to keep heat from leaking away, thus serving to confine heat generated by hot spot 14. This allows the program current to be between about 0.3 and 3 mA. Currents of this order pass through the base layers at a current density of about 16 mA/sq. micron, which causes the temperature there to exceed at least 100° C. This reduces the threshold field for magnetizing the pinned layer to between about 10 and 25 oersted. As soon as the programming current is turned off, the device cools rapidly and may then be safely interrogated.

As was note earlier, this differs from prior art reference U.S. Pat. No. 6,385,082 since the large write current does not flow through the tunnel junction but only through the thin pinned and base layers. Consequently, there is no risk of burning or degrading the tunnel junction from the large current density in the tunnel oxide.

What is claimed is:

1. An array of magnetic memory elements, comprising:
   a heating line, having a width and a thickness, that includes local heating elements each such heating element being located in close proximity to one of said memory elements; and
   a programming line that passes near a memory element.

2. The array described in claim 1 wherein said local heating elements further comprise portions of said heating line whose width is less than said heating line width.

3. The array described in claim 1 wherein said local heating elements further comprise portions of said heating line whose thickness is less than said heating line thickness.

4. The array described in claim 1 wherein said local heating elements further comprise portions of said heating line that have a higher sheet resistance than other portions of said heating line.

5. The array described in claim 1 wherein said memory element is selected from the group consisting of spin valves, pseudo-spin valves, and magnetic tunnel junctions.

6. The array described in claim 1 wherein each heating element is located less than about 2,000 Angstroms from a memory element.

7. The array described in claim 1 wherein said heating and programming lines are orthogonal to one another, said memory elements being located at their intersections.

8. The array described in claim 1 wherein said heating line is also a bit line.

9. The array described in claim 1 wherein said heating line is also a word line.

10. An array of magnetic memory elements, each memory element having a base layer, comprising:
    a bit line and a programming line, having a width and a thickness, whereby individual memory elements in said array may be addressed wherever said bit and programming lines intersect;
    said programming line being disposed to connect the memory elements, whereby the base layer of each memory element is a part of said programming line; and
    the resistance of the base layers being larger, relative to other parts of said programming line, whereby each base layer of each memory element is a heating element.

11. The array described in claim 10 wherein said memory element is selected from the group consisting of spin valves, pseudo-spin valves, and magnetic tunnel junctions.

12. A magnetic memory, comprising:
    an array of magnetic tunnel junction memory elements, each such memory element including a base layer having a first width;
    a programming line, having a second width that is greater than said first, width, that connects the memory elements, whereby the base layer of each memory element is part of said programming line and, by virtue of its reduced width, is a local source of, joule heat; and
    circuitry for selecting a single memory element of said array.

13. The memory described in claim 12 wherein said programming line has a width of about 0.2 microns.

14. The memory described in claim 12 wherein said programming line has a sheet resistance between about 52 and 86 milli-ohms per square and said base layer has a sheet resistance between about 40 and 80 ohms per square.

15. The memory described in claim 12 wherein said base layer further comprises a ferromagnetic layer on an antiferromagnetic layer on a seed layer.

16. The memory described in claim 12 wherein said base layer further comprises a ferromagnetic layer on a seed layer.

17. A process for programming a magnetic memory element, comprising:
    providing an array of magnetic memory elements;
    providing a heating line, having a width and a thickness, that includes local heating elements each such heating element being located in close proximity to one of said memory elements;
    providing a programming line that passes near a memory element;
    passing a first current through said heating line whereby a memory element is heated, thereby reducing said memory element's threshold field for magnetization;
    passing a second current through said programming line, said second current being sufficient to generate said reduced threshold field, whereby said memory element is magnetized and a bit of information is stored therein.

18. The process described in claim 17 wherein said heating elements are surrounded by thermally insulating material except between themselves and each memory element.

19. The process described in claim 17 wherein said local heating elements further comprise portions of said heating line whose width is less than said heating line width.

20. The process described in claim 17 wherein said local heating elements further comprise portions of said heating line whose thickness is less than said heating line thickness.

21. The process described in claim 17 wherein said local heating elements further comprise portions of said heating line that have a higher sheet resistance than other portions of said heating line.

22. The process described in claim 17 wherein said memory element is selected from the group consisting of spin valves, pseudo-spin valves, and magnetic tunnel junctions.

23. The process described in claim 17 wherein said first current is between about 0.3 and 3 mA.

24. The process described in claim 17 wherein said second current is between about 0.3 and 3 mA.

25. The process described in claim 17 wherein each heating element is located less than about 2,000 Angstroms from a memory element.

26. The process described in claim 17 wherein said heating and programming lines are orthogonal to one another, said memory elements being located at their intersections.

27. The process described in claim 17 wherein said heating line is also a bit line.

28. The process described in claim 17 wherein said heating line is also a word line.

29. A process for programming a magnetic memory element, comprising:
    providing an array of magnetic memory elements, each such memory element having a base layer;
    providing a bit line and a programming line, having a width and a thickness, whereby individual memory elements in said array may be addressed wherever said bit and programming lines intersect;
    disposing said programming line to connect the memory elements, whereby the base layer of each memory element is a part of said programming line;
    increasing the resistance of the base layers relative to all other parts of said programming line whereby each base layer of a memory element becomes a local source of heat;
    passing a first current through said programming line thereby generating a first magnetic field and whereby all base layers on said programming line heat their associated memory elements, thereby reducing said memory elements' threshold field for magnetization to a value;
    passing a second current through said bit line, thereby generating a second magnetic field, the combination of said first and second magnetic fields being sufficient to exceed said reduced threshold field value, whereby said memory element is magnetized and a bit of information is stored therein.

30. The process described in claim 29 wherein said memory element is selected from the group consisting of spin valves, pseudo-spin valves, and magnetic tunnel junctions.

31. The process described in claim 29 wherein said first current is between about 0.3 and 3 mA.

32. The process described in claim 29 wherein said second current is between about 0.3 and 3 mA.

33. A process for programming a magnetic tunnel junction, comprising:

providing an array of magnetic tunnel junction memory elements, each such memory element including a base layer having a first width;

providing a programming line, having a second width that is greater than said first width, that connects the memory elements, whereby the base layer of each memory element is part of said programming line and, by virtue of its reduced width, is a local source of joule heat;

selecting a single memory element of said array and then passing a current through said programming line whereby only said selected memory element is heated, thereby reducing said memory element's threshold field for magnetization; and said current also being sufficient to generate said reduced threshold field, magnetizing said memory element and storing therein a bit of information.

34. The process described in claim 33 wherein said base layer further comprises a ferromagnetic layer on an antiferromagnetic layer on a seed layer.

35. The process described in claim 33 wherein said base layer further comprises a ferromagnetic layer on a seed layer.

36. The process described in claim 33 wherein said current is between about 0.3 and 3 mA.

37. The process described in claim 33 wherein, at a current density of about 16 mA/sq. micron, said base layer reaches a temperature of at least 100° C. in less than about 0.1 microseconds.

38. The process described in claim 33 wherein said reduced threshold field is between about 10 and 25 oersted.

* * * * *